United States Patent [19]
Lo et al.

[11] Patent Number: 5,805,240
[45] Date of Patent: Sep. 8, 1998

[54] RADIO FREQUENCY TRANSMITTER HAVING CIRCUITRY FOR REGULATING A MIXING FREQUENCY ADJUSTING OUTPUT POWER, ELIMINATING HIGH FREQUENCY ABNORMALITIES, PREVENTING AUDIO/VISUAL INTERFERENCE, AND CONTROLLING OUTPUT INTENSITY

[75] Inventors: Yee-Cheng Lo, Tu Cheng City; Venson Liaw, Taipei Hsien, both of Taiwan

[73] Assignee: Forward Electronics Co., Ltd., Taipei, Taiwan

[21] Appl. No.: 579,161

[22] Filed: Dec. 27, 1995

[51] Int. Cl.[6] ............................... H04N 5/40; H04N 5/60
[52] U.S. Cl. ........................................... 348/724; 348/738
[58] Field of Search ...................... 348/724, 738, 348/484, 723; 455/108, 120, 109

[56] References Cited

U.S. PATENT DOCUMENTS

| | | | |
|---|---|---|---|
| 4,975,775 | 12/1990 | Satoh | 348/738 |
| 5,047,860 | 9/1991 | Reginski | 348/724 |
| 5,072,297 | 12/1991 | Kanazawa | 348/738 |
| 5,428,404 | 6/1995 | Ingram et al. | 348/724 |
| 5,467,141 | 11/1995 | Ligertwood | 348/724 |

*Primary Examiner*—Victor R. Kostak
*Attorney, Agent, or Firm*—Bacon & Thomas

[57] ABSTRACT

A radio frequency transmitter includes a video signal input terminal, an audio signal input terminal, a variable frequency modulation degree circuit, a band pass filter, a sound intensity regulation circuit, a voltage controlled oscillator, a modulation mixer, and an amplifying circuit. The transmitter is arranged to eliminate high frequency abnormalities, prevent interference of audio signals with video signals, stabilize the audio frequency response of the transmitter, and improve circuit stability.

4 Claims, 2 Drawing Sheets

RADIO FREQUENCY TRANSMITTER HAVING CIRCUITRY FOR REGULATING A MIXING FREQUENCY ADJUSTING OUTPUT POWER, ELIMINATING HIGH FREQUENCY ABNORMALITIES, PREVENTING AUDIO/VISUAL INTERFERENCE, AND CONTROLLING OUTPUT INTENSITY

BACKGROUND OF THE INVENTION

The present invention relates to radio frequency transmitters, and more particularly to a radio frequency transmitter with an abnormality prevention circuit and an amplifying circuit.

Conventional radio frequency transmitters use high harmonics generated by a crystal oscillator to amplify audio and video modulation carriers for sending signals. Such transmitters cannot effectively control their modulation degree, output power level, and radiation, and it is therefore not easy for them to comply with the provisions set forth in Part 15 of FCC Rules, causing them to be unsalable in the U.S. and resulting in huge losses for their manufacturers. The inability to regulate output power also causes problems in production and sales with respect to other countries, because the rules for radiation intensity vary, and because the crystal oscillation is used for one single channel only, two or more transmitting sets would interfere with each other.

SUMMARY OF THE INVENTION

The present invention has been accomplished under the aforesaid circumstances. It is the primary object of the present invention to provide a radio frequency transmitter which has an abnormality prevention circuit and an amplifying circuit to regulate the output frequency of a modulation mixer, adjust the output power, eliminate any abnormality occurring at high frequency, prevent the interference of audio signals with video signals, stabilize the audio frequency response, and control the radio frequency output intensity.

It is another object of the present invention to provide a radio frequency transmitter which has a voltage stabilized source output to supply stable power to the voltage controlled oscillator; an abnormality prevention circuit connected to the amplifying circuit to prevent any abnormal oscillation caused by feedback when the signals of the amplifying circuit are at high frequency; and a channel switching circuit connected to the voltage controlled oscillator for switching the channels by regulating the tuned voltage.

According to the preferred embodiment of the present invention, the radio frequency transmitter comprises a video signal input terminal; an audio signal input terminal; a variable frequency modulation degree circuit connected to with the audio signal input terminal to control the audio frequency modulation within a specified range for stabilizing the audio frequency response; a band pass filter connected to the variable frequency modulation circuit to allow only the signals within the specified frequency range to pass therethrough; a sound intensity regulation circuit for regulating the intensity of a signal received from the band pass filter to control the output intensity difference between audio and video signals within a specified range; a voltage controlled oscillator having a tuned voltage input to accurately regulate the signal outputs at different frequencies; a modulation mixer connecting with the voltage control oscillator, the sound intensity regulation circuit and the video signal input terminal for using the output signal frequency of the voltage control oscillator as a mixed frequency to have audio and video signals synthesized into stabilized signals; an amplifying circuit for receiving the output signals from the modulation mixer, and regulating and amplifying them; and a transmitter for transmitting the signals given by the amplifying circuit.

DETAILED DESCRIPTION OF THE PREFERRED EMBODIMENT

Figure 1:
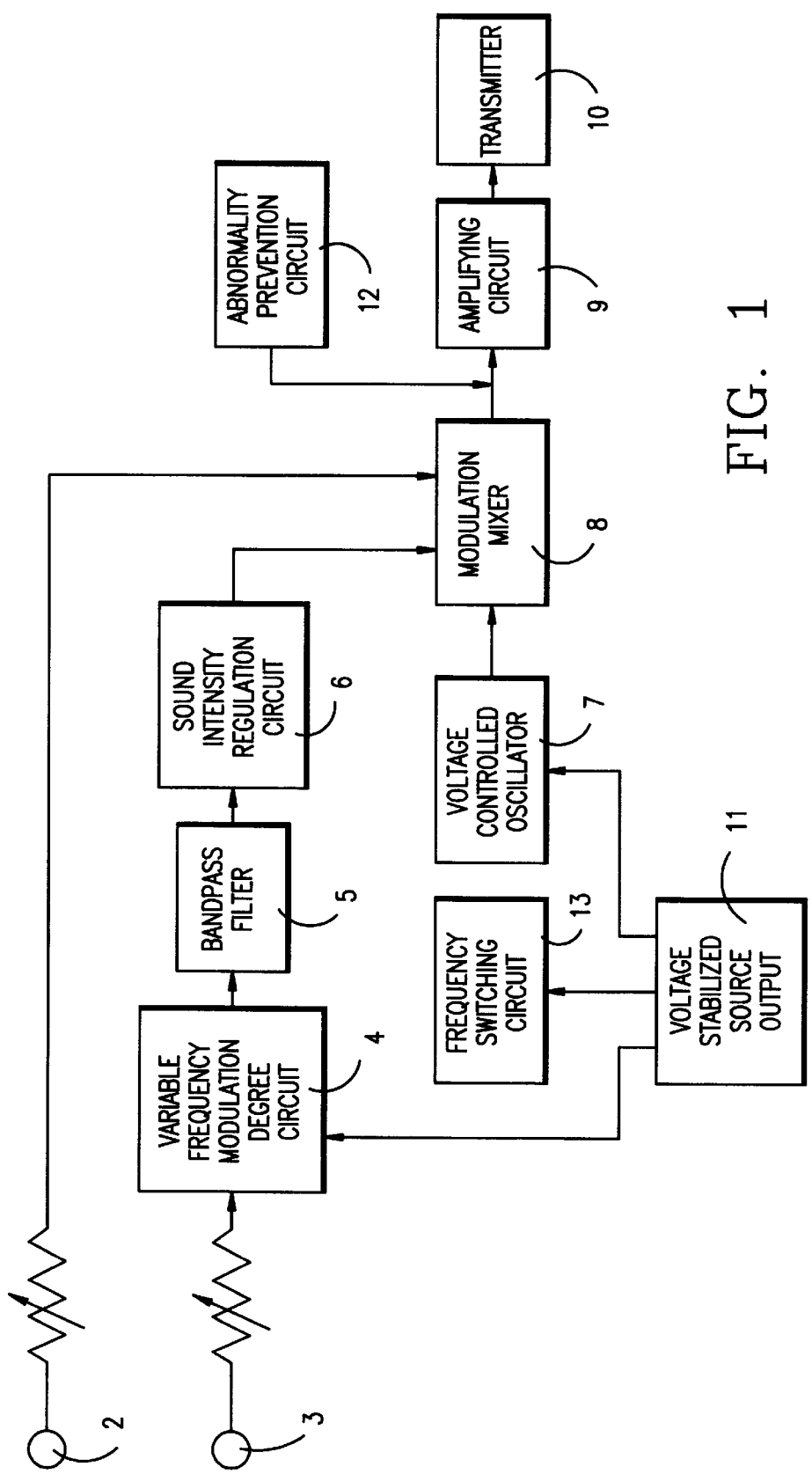
FIG. 1 is a block diagram of a radio frequency transmitter according to the present invention.

Referring to FIG. 1, a radio frequency transmitter in accordance with the present invention is generally comprised of a video signal input terminal 2, an audio signal input terminal 3, a variable frequency modulation degree circuit 4, a band pass filter 5, a sound intensity regulating circuit 6, a voltage controlled oscillator 7, a modulation mixer 8, an amplifying circuit 9, a transmitter 10, a voltage stabilized source output 11, an abnormality prevention circuit 12, and a frequency switching circuit 13.

Figure 2:
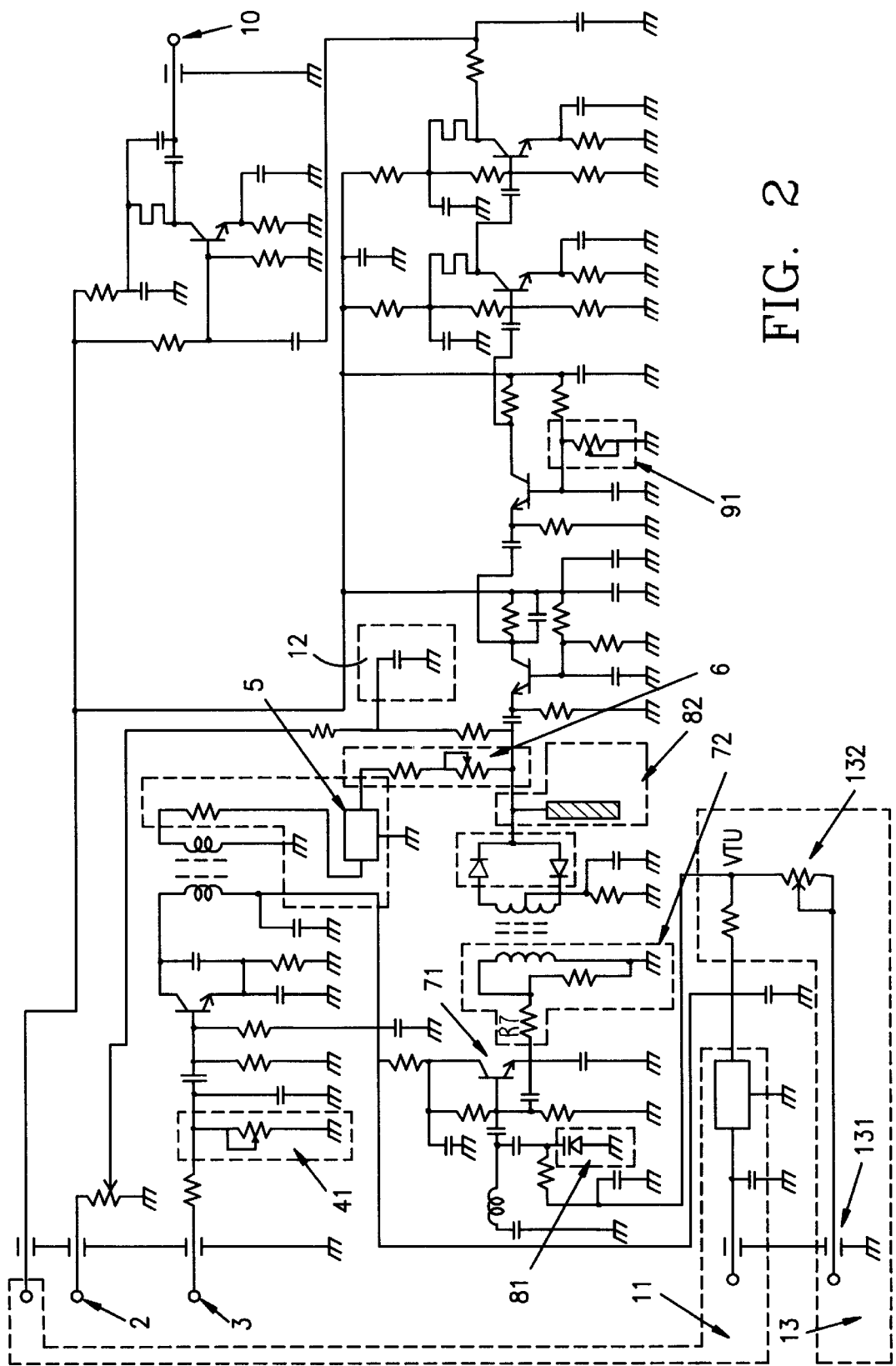
FIG. 2 is a circuit diagram of a radio frequency transmitter according to the present invention.

Referring again to FIG. 1 and also to FIG. 2, the video signal to be transmitted is input through the video signal input terminal 2, while the voice signal to be transmitted is input through the audio signal input terminal 3. The variable frequency modulation degree circuit 4 is used to vary the audio signal input and control the audio frequency modulation degree within a specified limit for stabilizing the audio frequency response, by means of a variable resistor 41.

The band pass filter 5 is connected to the variable frequency modulation degree circuit 4 and allows only those audio signals within the specified frequency range to pass therethrough for filtering off unnecessary noise and lower the voltage of spurious audio out band spurious signals to prevent them from interfering with other normal signals, thus improving the output characteristics.

Sound intensity regulating circuit 6 regulates the intensity of an audio signal to vary the sound carrier frequency of 4.5 MHz, maintaining the output frequency difference between the sound carrier and the video carrier within a specified limit, and preventing them from interfering with each other to stabilize the audio quality.

Voltage controlled oscillator 7 uses the tuned voltage to control and vary the capacity of a capacitor diode for determining the frequency of output signal. Its output frequency is used by the modulation mixer 8 to synthesize video and audio signals.

By regulating a variable capacitance diode 81 in the voltage control oscillator 7, the oscillation of LC tuned frequency is varied, thus changing the carrier frequency of the output signal, so that two or more transmitting sets can be used simultaneously.

When a channel switch 131 in the channel switching circuit 13 is open, the tuned voltage is set at $V_{tu}$=5 V. If the channel switch 131 is grounded, the tuned voltage can use a variable resistor 132 to regulate setting voltage to simplify the channel switching.

To prevent unavailability of a normal modulation degree caused by the deviation of super high frequency characteristics of T2 BALUN when the mixed frequency ranges between 902 MHz and 928 MHz, a guide means 82 is used for fine tuning the capacity to give a 100% modulation degree, making the color phase natural and undistorted.

Mixed frequency is important for improving the stability of signal modulation mixing, especially in case a certain mixing intensity is specified for a super high frequency ranging between 902 MHz and 928 MHz. To that end, a R7 resistor 72 is commonly used by the emitter resistance of a local oscillating transistor 71 and the output of oscillated frequency (mixed frequency) in the voltage control oscillator 7, thus fixing the output intensity of oscillation frequency (mixed frequency) to control the voltage level given by oscillation to the mixer, making the intensity of the oscillator output balanced and stable.

The voltage stabilized source output 11 ensures that the voltage control oscillator 7 is supplied with a stable voltage source which is different from the power source provided by the amplifying circuit 9, thus stabilizing the signal output frequency to keep the oscillation frequency from being affected by variation of the power source provided by the amplifying circuit 9.

The modulation mixer 8 uses the output of the voltage control oscillator 7 for mixing the modulation frequencies to synthesize audio and video signals.

The amplifying circuit 9 adjustably amplifies the output signal from the modulation mixer 8 by using a variable resistor 91 as a bias control circuit for the base of transistor Q5 2SC3793 to control the output intensity of the amplified signal, enabling the output intensity of all radio frequencies to be adjusted to a specified value to meet the rules for radiation intensity of every country.

The abnormality prevention circuit 12 uses the capacity as a high frequency damping to avoid the occurrence of any abnormality resulted from the feedback of signals to the oscillation circuit from the amplifying circuit 9.

The transmitter 10 transmits the output signal of the amplifying circuit to complete the transmission procedure.

The radio frequency transmitter in accordance with the present invention is available to accurately regulate the mixed modulation frequency, adjust the output power, avoid the abnormality occurs at high frequency, prevent the interference of audio with video signals, stabilize the audio frequency response, control the RF output intensity, and improve circuit stability. Therefore, it not only improves performance, but is more suitable for production and sales due to the fact that even the electromagnetic radiation can be effectively controlled to meet all the requirements specified in every country.

While only one embodiment of the present invention has been shown and described, it will be understood that various modifications and changes could be made without departing from the spirit and scope of the present invention.

What is claimed is:

1. A radio frequency transmitter, comprising:

a video signal input terminal;

an audio signal input terminal;

a variable frequency modulation degree circuit connected to said audio signal input terminal to control the audio frequency modulation degree within a specified range for stabilizing the audio frequency response;

a band pass filter connected to said variable frequency modulation degree circuit to allow for the signals within the specified frequency range only to pass therethrough;

a sound intensity regulation circuit for regulating the intensity of a signal received from said band pass filter to control the output intensity difference between audio and video signals within a specified range;

a voltage controlled oscillator having a tuned voltage input to regulate the signal outputs at different frequencies;

a modulation mixer connected to said voltage controlled oscillator, said sound intensity regulation circuit and said video signal input terminal for using the output signal frequency of said voltage controlled oscillator as a mixed frequency to have audio and video signals synthesized into stabilized signals;

an amplifying circuit for receiving the output signals from said modulation mixer to have these signals regulated and amplified; and a transmitter for transmitting the signals given by said amplifying circuit.

2. The radio frequency transmitter of claim 1 further comprising a voltage stabilized source output to supply stable power source to said voltage control oscillator.

3. The radio frequency transmitter of claim 1 further comprising an abnormality prevention circuit connected to said amplifying circuit to prevent any abnormal oscillation caused by feedback when the signals of said amplifying circuit are at high frequency.

4. The radio frequency transmitter of claim 1 further comprising a channel switching circuit connected to said voltage control oscillator for switching the channels by regulating the tuned voltage.

* * * * *